United States Patent [19]

Allen et al.

[11] Patent Number: 4,949,161
[45] Date of Patent: Aug. 14, 1990

[54] INTERDIGITIZED LEADFRAME STRIP

[75] Inventors: Timothy J. Allen; Alan G. Wood, both of Boise, Id.

[73] Assignee: Micron Technology, Inc., Boise, Id.

[21] Appl. No.: 290,261

[22] Filed: Dec. 23, 1988

[51] Int. Cl.$^5$ .............................................. H01L 23/48
[52] U.S. Cl. ...................................... 357/70; 357/68; 357/69; 437/206; 437/217; 437/220
[58] Field of Search ........................ 357/70, 69, 68; 437/206, 217, 220, 219, 214

[56] References Cited

FOREIGN PATENT DOCUMENTS

| 0166945 | 12/1980 | Japan | 357/70 |
| 0021362 | 2/1983 | Japan | 357/70 |
| 0098549 | 6/1984 | Japan | 357/70 |
| 0154650 | 8/1985 | Japan | 357/70 |
| 0085848 | 5/1986 | Japan | 357/70 |
| 2025129 | 1/1980 | United Kingdom | 357/68 |

Primary Examiner—Rolf Hille
Assistant Examiner—Minh L. Tran
Attorney, Agent, or Firm—Angus C. Fox, III; Stanley N. Protigal; Jon P. Busack

[57] ABSTRACT

An improved interdigitized leadframe strip having a pair of rail stubs coextensive with the exposed pins of the leadframes at either end of the strip, which can still be stamped from a continuous strip without any waste of material between the individual strips. The split rail stubs are still considerably wider than the exposed pins of the end leadframes and hence, offer considerable protection to the exposed pins from mechanical damage.

4 Claims, 1 Drawing Sheet

INTERDIGITIZED LEADFRAME STRIP

FIELD OF THE INVENTION

This invention relates to semiconductor leadframe strips, and more specifically, to an improved design for the rails which affords protection to the exposed pins of the leadframes at either end of interdigitized leadframe strips.

BACKGROUND OF THE INVENTION

Integrated semiconductor devices are typically constructed en masse on a wafer of silicon or gallium arsenide. Each device generally takes the form of an integrated circuit (IC) die, which is attached to a leadframe with aluminum, copper or gold wires. The die and leadframe are then encapsulated in a plastic package, which is then recognizable as an IC "chip".

FIG. 1 is a top plan view of a standard dual-inline-package leadframe strip having four interconnected leadframes 11. Leadframe strips with any number of leadframes can be made to order. Leads or pins 12 within a particular leadframe are connected to adjacent pins and a pair of parallel rails 13 by a network of expendable dam bars 14. It will be noted that except at the ends of the leadframe strip, the pins 12 of one leadframe are connected end-to-end to the pins of an adjacent leadframe. Conventional leadframes have a die-mounting paddle 15 that is attached to the rails 13 by expendable tie bars 16. Following the attachment of an IC die on the paddle 15, each die and associated leadframe center section (the center section includes the paddle 15 and the end of each pin which is adjacent paddle 15) are encapsulated in plastic. During the encapsulation process, the dam bars 14 prevent plastic encapsulation compound from seeping between the pins 12. After encapsulation, the pins of individual leadframes are separated from those of adjacent leadframes and from the rails 13 in a trim and form operation. In this operation, the dam bars 14 and tie bars 16 are also stamped out and discarded, and the leads 12 are bent into their final configuration. It will be noted that both rails 13 of a standard leadframe strip are coextensive with the pins 12 of the two leadframes at either end of the strip which are exposed. The pair of rail stubs 17 at each end of the strip afford protection to the exposed pins against bending and breaking, since their much greater width makes them much stiffer than the pins 12.

FIG. 2 is a top plan view of a typical interdigitized dual-inline-package leadframe strip showing six interconnected leadframes (as is the case with standard leadframe strips, the actual number of leadframes on a strip may vary). The pins 21 of adjacent leadframes are intermeshed in order to incorporate a larger number (typically an increase of roughly thirty percent) of leadframes on the strip. The system of dam bars 22 and tie bars 23 is similar to that used with the standard leadframe depicted in FIG. 1. It will be noted for the interdigitized leadframe strip depicted in FIG. 2 that, except at the ends of the leadframe strip where exposed pins 24 are located, the pins of adjacent leadframes are connected at their outer ends to a dam bar which pertains to an adjacent leadframe. Since the individual leadframe strips are cut from a much longer strip without discarding material between individual strips, it was deemed necessary to cut off one rail stub at each end of each interdigitized leadframe strip so that they could remain attached to the adjacent leadframe strips. Locations 25 are the sites of the missing rail stubs. Such a design affords little protection for the exposed pins 24 at either end of the leadframe strip, hence pins become bent and otherwise damaged if not handled with extreme care. Bent pins will require either discarding or repair of the leadframe strip--resulting in either increased material costs or increased labor costs.

SUMMARY OF THE INVENTION

The objective of the present invention was the creation of an interdigitized leadframe strip, having a pair of rail stubs coextensive with the exposed pins of the leadframes at either end of the strip, which can still be stamped from a continuous strip without any waste of material between the individual strips.

The aforementioned objective has been accomplished by splitting each of the four rail stubs on a leadframe strip in half so that adjacent leadframes will also have split rail stubs. The split rail stubs are still considerably wider than the exposed pins of the end leadframes and hence, offer considerable protection to the exposed pins from mechanical damage.

DETAIL DESCRIPTION OF THE PREFERRED EMBODIMENT

Figure 1:
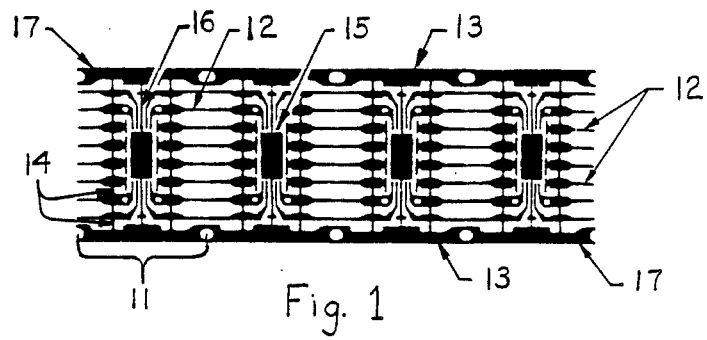
FIG. 1 is a top plan view of a standard dual-inline-package leadframe strip.
Figure 2:
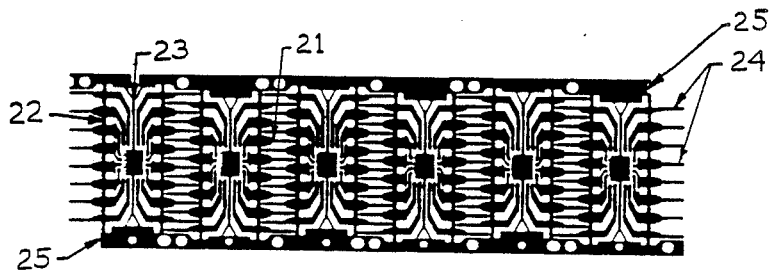
FIG. 2 is a top plan view of a typical interdigitized dual-inline-package leadframe strip.

Referring now to the standard interdigitized dual-inline-package leadframe strip of FIG. 2, it will be noted that at positions 23 and 24 one rail stub at each end of the strip is absent, as it has been incorporated in the adjacent strip during the stamping process. As heretofore mentioned, such a design affords little protection for the exposed pins 22 at either end of the strip.

Figure 3:
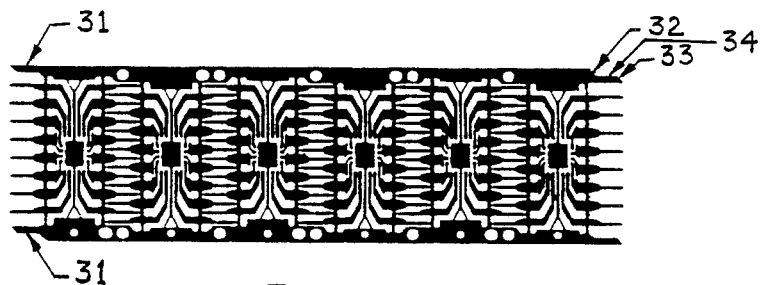
FIG. 3 is a top plan view of an improved interdigitized dual-inline-package leadframe strip.

Referring now to the improved interdigitized dual-inline-package leadframe strip of FIG. 3, instead of incorporating one of the two rail stubs into the adjacent strip such that each leadframe strip has but one rail stub at each end, all adjacent pairs of leadframe strips share each common rail stub equally. Each full-width rail stub is therefore longitudinally split such that each end of the rail has a split rail stub that is essentially half the width of the standard rail in a corresponding section of the leadframe strip. Therefore each of the two split rail stubs 31 at each end of a strip are essentially half the standard rail width and coextensive with the exposed connector pins 22 of the adjacent leadframe. Such a sharing arrangement provides considerably more protection to the exposed connector pins 22 and results in far fewer damaged end pins during the manufacturing process. In order to decrease the susceptibility of the split rail stubs 31 to bending, the ends 33 of split rail stubs 31, instead of being squared off, are angled at 45 degrees, so that the base 32 of the other half of the split rail stub on the adjoining leadframe strip may be tapered. Since the thin shank 34 of each split rail stub is thus shortened and the stress is relieved at the base 32 of each split rail stub 31 (in comparison with split rail stubs having no tapered base), the split rail stubs 31 are less susceptible to bending than they would be if they had squared-off ends.

The invention as described herein represents only the preferred embodiment of the device. Other equivalent embodiments, such as a diagonal splitting of the entire leadframe rail stub, are covered within the scope and spirit of the following claims.

We claim:

1. An improved leadframe strip of the type having a pair of rails and a plurality of leadframes, each of which is attached on opposite sides to one of said rails by a framework of expendable support members such as dams and tie bars that are removable during a trim and form operation, and said leadframes being positioned such that, except at the ends of the strip where the pins of end leadframes are exposed, the pins of one leadframe are interdigitized with those of an adjacent leadframe, wherein the improvement consists of each rail having a stub at each end thereof which is coextensive with the exposed pins of the leadframe at that end of the strip, and which is essentially half the width of the same rail in corresponding sections of the strip.

2. The improved leadframe strip of claim 1, wherein said rail stubs have diagonally-tapered ends and diagonally-tapered bases.

3. An improved leadframe strip of the type having a pair of rails and a plurality of leadframes, each of which is attached on opposite sides to one of said rails by a framework of expendable support members such as dams and tie bars that are removable during a trim and form operation, and said leadframes being positioned such that, except at the ends of the strip where the pins of end leadframes are exposed, the pins of one leadframe are interdigitized with those of an adjacent leadframe, wherein the improvement consists of longitudinally splitting in half the rail sections which are shared by adjacent, interdigitized leadframes as the ends of each strip are formed, resulting in rail stubs at the end of each rail which are coextensive with the exposed pins of the leadframe at that end of the strip, and are serially stampable from a continuous band of sheet metal material with no loss of material between individual strips.

4. The improved leadframe strip of claim 3, wherein said rail stubs have diagonally-tapered ends and diagonally-tapered bases.

* * * * *